United States Patent
Gauss et al.

(10) Patent No.: US 7,622,928 B2
(45) Date of Patent: Nov. 24, 2009

(54) RF TRAPS FOR RADIO FREQUENCY COILS USED IN MRI

(75) Inventors: Robert Gauss, Aurora, OH (US); Eddy Wong, Richmond Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/067,379

(22) PCT Filed: Aug. 21, 2006

(86) PCT No.: PCT/IB2006/052877

§ 371 (c)(1),
(2), (4) Date: Mar. 19, 2008

(87) PCT Pub. No.: WO2007/034341

PCT Pub. Date: Mar. 29, 2007

(65) Prior Publication Data

US 2008/0191699 A1    Aug. 14, 2008

Related U.S. Application Data

(60) Provisional application No. 60/718,816, filed on Sep. 20, 2005.

(51) Int. Cl.
    *G01V 3/00* (2006.01)
(52) U.S. Cl. ...................... 324/322; 324/318
(58) Field of Classification Search ......... 324/300–322, 324/318
    See application file for complete search history.

(56) References Cited

U.S. PATENT DOCUMENTS

| | | | |
|---|---|---|---|
| 4,620,155 A | | 10/1986 | Edelstein |
| 4,742,304 A | | 5/1988 | Schnall et al. |
| 4,792,759 A | | 12/1988 | Keren et al. |
| 4,881,034 A | * | 11/1989 | Kaufman et al. ............ 324/318 |
| 4,922,204 A | * | 5/1990 | Duerr et al. ................. 324/322 |
| 5,038,105 A | | 8/1991 | Codrington et al. |
| 5,107,217 A | | 4/1992 | Duerr |
| 5,351,688 A | * | 10/1994 | Jones ......................... 600/422 |
| 5,477,147 A | | 12/1995 | Friedrich et al. ............ 324/322 |
| 5,708,361 A | * | 1/1998 | Wang et al. ................. 324/318 |
| 5,998,999 A | * | 12/1999 | Richard et al. .............. 324/318 |
| 6,307,371 B1 | | 10/2001 | Zeiger |
| 6,326,789 B1 | * | 12/2001 | Yoshida et al. .............. 324/318 |
| 6,605,775 B1 | * | 8/2003 | Seeber et al. ............... 174/359 |
| 6,664,465 B2 | * | 12/2003 | Seeber ....................... 174/363 |
| 6,670,863 B2 | * | 12/2003 | Van Helvoort et al. ........ 333/12 |
| 6,825,661 B2 | * | 11/2004 | Leussler ..................... 324/318 |
| 6,992,486 B2 | * | 1/2006 | Srinivasan ................... 324/318 |
| 2006/0290448 A1 | * | 12/2006 | Wynn et al. ................. 333/176 |

* cited by examiner

*Primary Examiner*—Brij B. Shrivastav
*Assistant Examiner*—Dixomara Vargas

(57) ABSTRACT

A radio frequency coil includes an operative radio frequency circuit (100, 100') and a trap radio frequency circuit (110, 110'). The operative radio frequency circuit is tuned to a magnetic resonance frequency and is spatially configured to at least one of generate magnetic resonance in or receive magnetic resonance from a spatial region of interest. The trap radio frequency circuit is tuned to block a selected frequency and is disposed with the operative radio frequency circuit. The trap radio frequency circuit includes at least a generally linear transmission line (120) having a first end (122, 122') at which the operative radio frequency circuit and the trap radio frequency circuit are coupled together and a second end (124) at which the generally linear transmission line is terminated with a termination impedance (136).

17 Claims, 3 Drawing Sheets

RF TRAPS FOR RADIO FREQUENCY COILS USED IN MRI

CROSS REFERENCE TO RELATED APPLICATIONS

Figure 1:
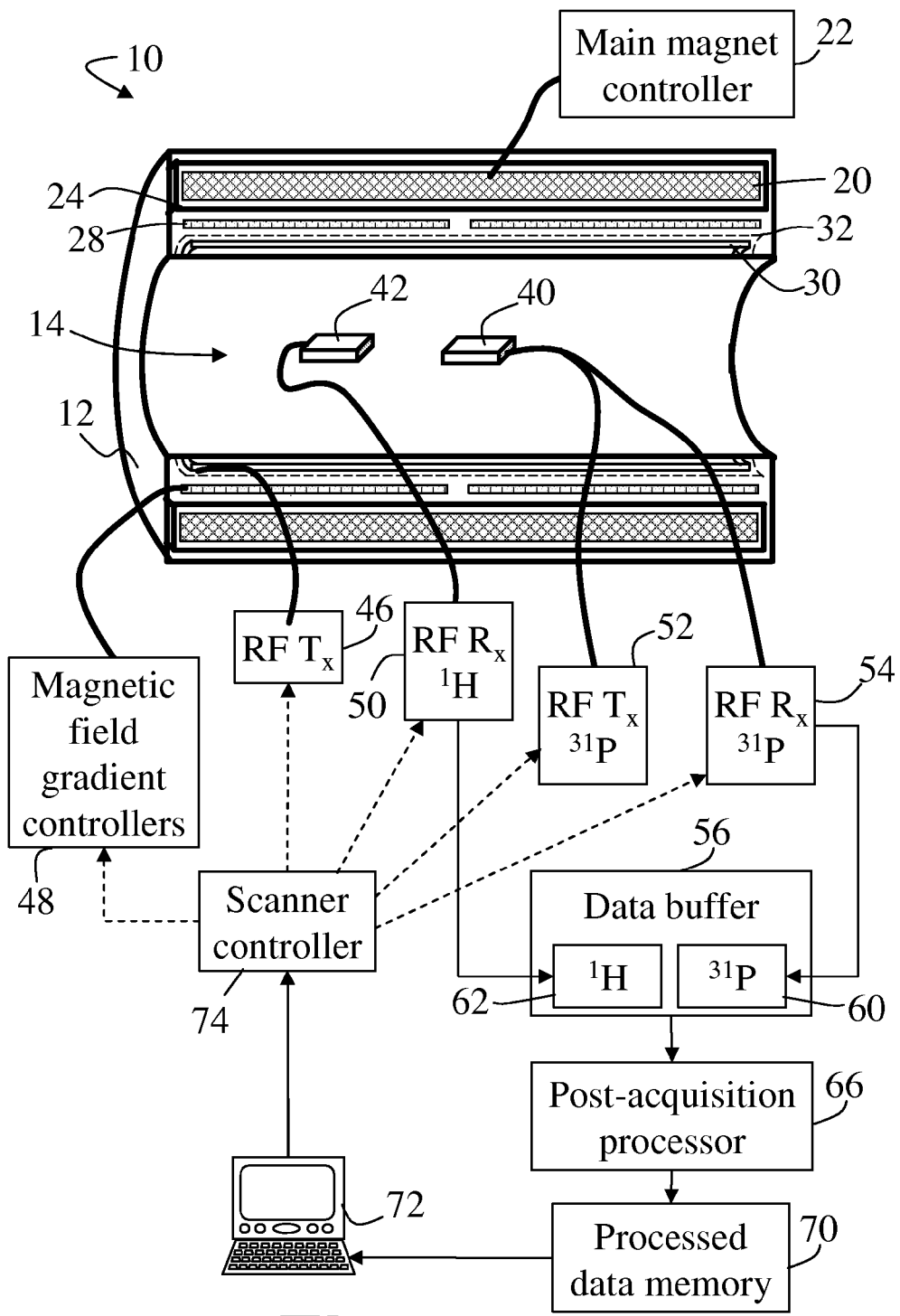

This application claims the benefit of U.S. provisional application Ser. No. 60/718,816 filed Sep. 20, 2005, which is incorporated herein by reference.

The following relates to the magnetic resonance arts. It finds particular application in conjunction with radio frequency coils for acquiring multi-nuclear magnetic resonance, and will be described with particular reference thereto. It finds application more generally in conjunction with local radio frequency coils for magnetic resonance spectroscopy, magnetic resonance imaging, and so forth.

In multi-nuclear magnetic resonance data acquisition, magnetic resonance are typically acquired from nuclear species other than proton ($^1$H) nuclear species. Proton images may also be acquired for reference and to provide localization. Proton magnetic resonance may or may not be acquired as substantive data of the multi-nuclear experiment.

The $^{31}$P magnetic resonance is one nuclear species whose magnetic resonance is sometimes acquired during multi-nuclear magnetic resonance data acquisition. Different receive radio frequency coils are used to receive the $^1$H and $^{31}$P magnetic resonances, respectively. A problem arises in that the phosphorous receive coil may be overwhelmed by the larger $^1$H excitation signal even though the phosphorous receive coil is tuned to the $^{31}$P magnetic resonance frequency.

Similar problems can arise in other magnetic resonance acquisition contexts. For example, the proton receive coil is tuned to the $^1$H excitation frequency. The proton coil therefore can conduct excessive current during the excitation phase of the magnetic resonance acquisition, due to strong coupling with the excitation radio frequency field.

Typically, such problems are addressed by providing an LC trap on the radio frequency coil. The LC trap is a resonant trap including an inductor and a capacitor connected in parallel across a gap in the coil. In the case of the phosphorous coil, for example, the LC trap is tuned to the $^1$H magnetic resonance frequency so as to substantially suppress coupling with the excitation field. In the case of the proton coil, the LC trap is tuned to the $^1$H frequency and includes a switch, such as a biased series-connected PIN diode, that couples the LC trap with the coil to detune the proton coil during the transmit phase. During the receive phase, the PIN diode is made non-conductive to decouple the LC trap from the coil to allow receiving of the $^1$H proton magnetic resonance.

Existing LC traps for magnetic resonance coils have certain disadvantages. The inductor is a relatively large component containing a substantial amount of electrically conductive material, and can produce shadowing or other distortion of images or artifacts in spectroscopic data. Moreover, inductors can produce substantial stray electric and magnetic fields. Such field leakage can be reduced by using low leakage inductor designs, such as balanced butterfly traps. Low leakage inductor designs reduce, but do not eliminate, the field leakage problem. Field leakage from the inductor further distorts magnetic resonance images and spectroscopic data.

The following contemplates improvements that overcome the aforementioned limitations and others.

According to one aspect, a radio frequency coil is disclosed. An operative radio frequency circuit is tuned to a magnetic resonance frequency and is spatially configured to at least one of generate magnetic resonance in or receive magnetic resonance from a spatial region of interest. A trap radio frequency circuit is tuned to block a selected frequency and is disposed with the operative radio frequency circuit. The trap radio frequency circuit includes at least a generally linear transmission line having a first end at which the operative radio frequency circuit and the trap radio frequency circuit are coupled together and a second end at which the generally linear transmission line is terminated with a termination impedance.

According to another aspect, a magnetic resonance system is disclosed. A main magnet is provided for generating a main magnetic field in a spatial region of interest. Magnetic field gradient coils are provided for superimposing selected magnetic field gradients on the main magnetic field. A radio frequency coil is provided, including an operative radio frequency circuit and a trap radio frequency circuit. The operative radio frequency circuit is tuned to a magnetic resonance frequency and is spatially configured to at least one of generate magnetic resonance in or receive magnetic resonance from a spatial region of interest. The trap radio frequency circuit is tuned to block a selected frequency and is disposed with the operative radio frequency circuit. The trap radio frequency circuit includes at least a generally linear transmission line having a first end at which the operative radio frequency circuit and the trap radio frequency circuit are coupled together and a second end at which the generally linear transmission line is terminated with a termination impedance.

According to another aspect, a magnetic resonance coil is disclosed for at least receiving resonance signals. An operative radio frequency circuit is tuned to a magnetic resonance frequency and is spatially configured to at least one of generate magnetic resonance in or receive magnetic resonance from a spatial region of interest. A trap radio frequency circuit is tuned to block a selected frequency. The trap radio frequency circuit is disposed with the operative radio frequency circuit and includes a coaxial cable. The coaxial cable has a first end at which an inner conductor and a coaxial sheath are electrically connected with the operative radio frequency circuit and a second end at which the inner conductor and coaxial sheath are terminated together.

One advantage resides in providing a radio frequency coil with reduced magnetic resonance data distortion due to the physical bulk of a radio frequency trap.

Another advantage resides in providing a radio frequency coil with reduced magnetic resonance data distortion due to radio frequency leakage of inductive trap components.

Another advantage resides in simplified radio frequency coil construction.

Another advantage resides in simplified tuning of the trap circuit of a radio frequency coil.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows an example magnetic resonance system employing a radio frequency coil having a transmission line based trap.

Figure 2:
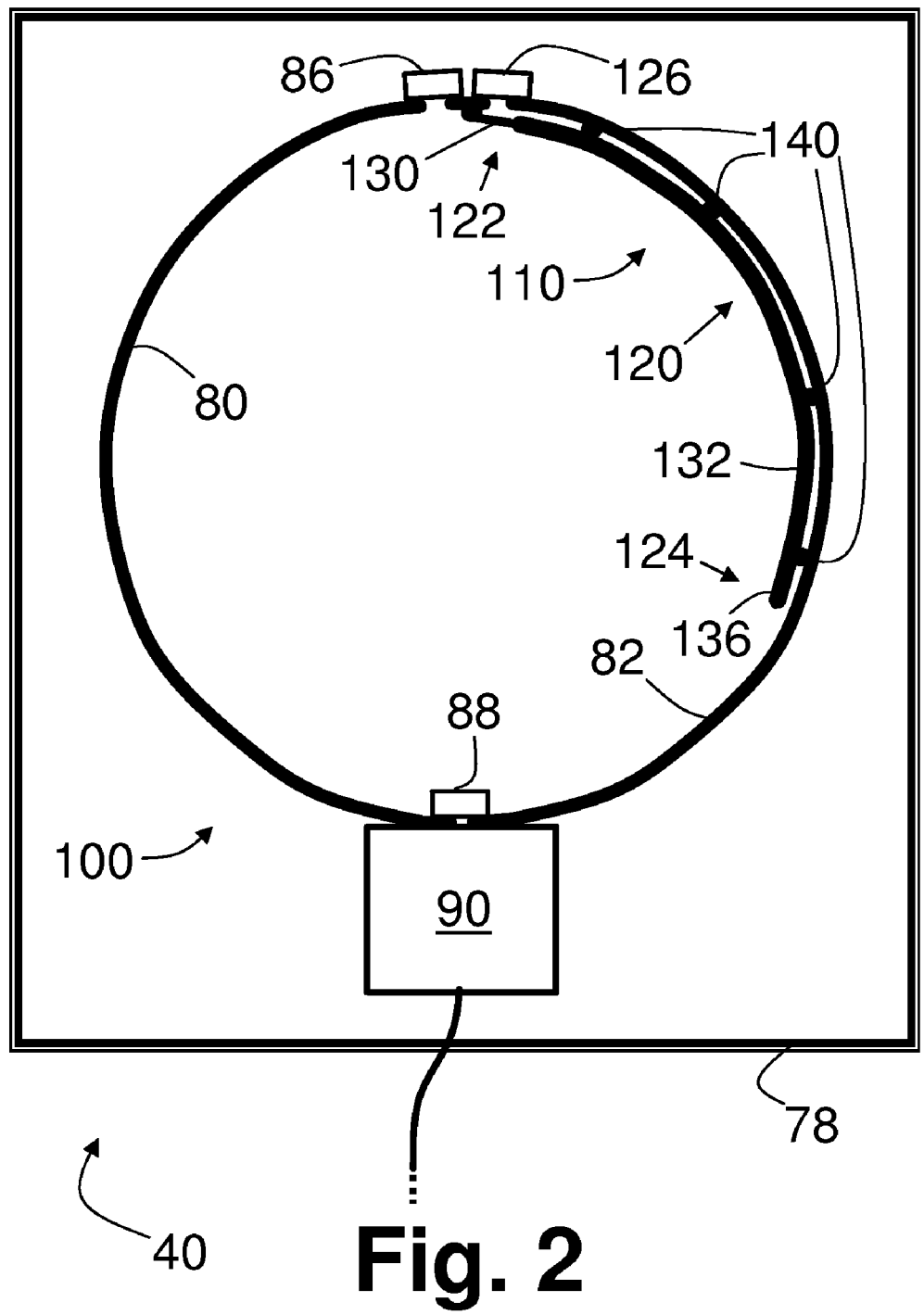

FIG. 2 diagrammatically shows a plan view of the phosphorus radio frequency coil with transmission line based trap of FIG. 1 with a housing cover removed to reveal internal components including the transmission line based trap.

Figure 3:
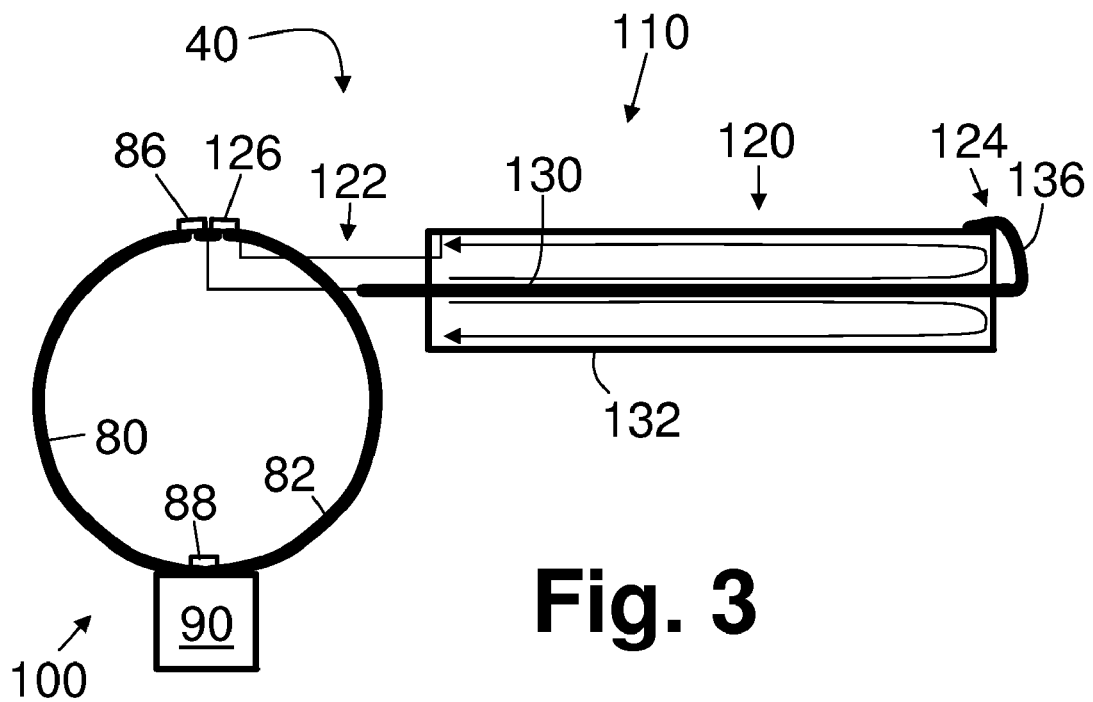

FIG. 3 diagrammatically shows an electrical schematic of the coil of FIG. 2.

Figure 4:
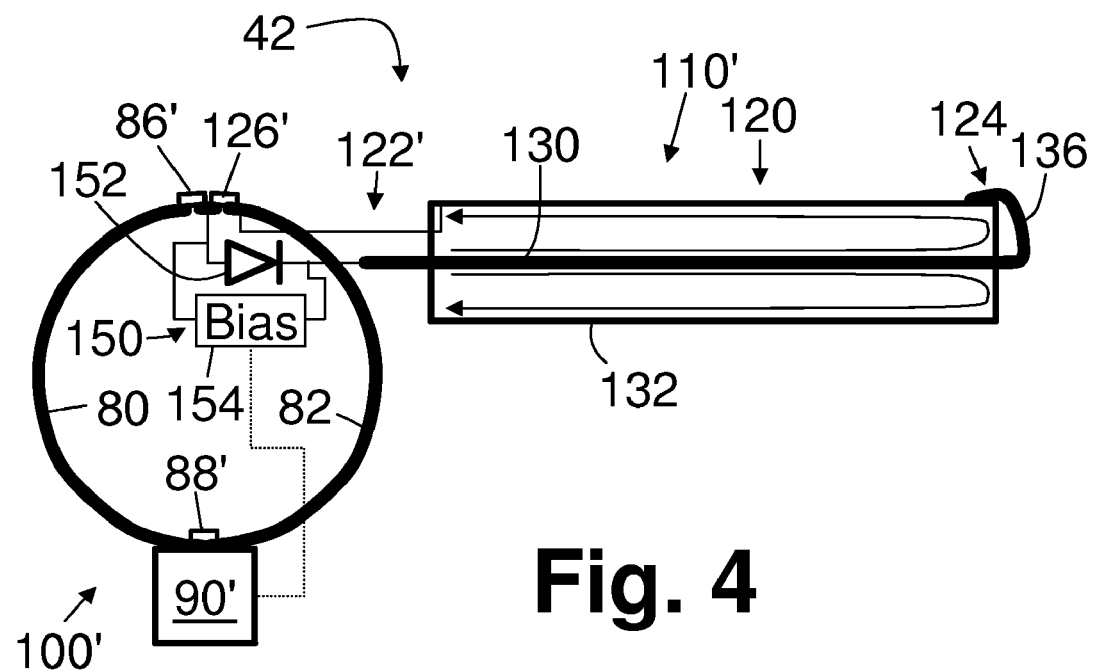

FIG. 4 diagrammatically shows an electrical schematic of the proton radio frequency coil of FIG. 1, which includes a transmission line based trap serving as a switchable detuning circuit.

With reference to FIG. 1, a magnetic resonance scanner 10 includes a scanner housing 12 including a bore 14 or other receiving region for receiving a patient or other subject. A main magnet 20 disposed in the scanner housing 12 is controlled by a main magnet controller 22 to generate a main $B_0$ magnetic field at least in a region of interest of the bore 14. Typically, the main magnet 20 is a persistent superconducting magnet surrounded by cryoshrouding 24, although a resistive main magnet can be used.

Magnetic field gradient coils 28 are arranged in or on the housing 12 to superimpose selected magnetic field gradients on the main magnetic field at least in a region of interest. Typically, the magnetic field gradient coils include coils for producing three orthogonal magnetic field gradients, such as an x-gradient, y-gradient, and z-gradient. A whole-body radio frequency coil 30 is optionally disposed in housing 12, as shown, or in the bore 14 of the scanner 10, to inject $B_1$ radio frequency excitation pulses. The radio frequency coil 30 is generally cylindrical and coaxially aligned with the bore 14 of the scanner 10, and includes a surrounding coaxial, generally cylindrical radio frequency shield 32. Additionally, one or more local radio frequency coils are disposed in the bore 14 for receiving magnetic resonances excited by the whole-body coil 30. In the example illustrated embodiment, two local surface coils 40, 42 are disposed in the bore. The local coil 40 is tuned to the $^{31}P$ magnetic resonance frequency, while the local coil 42 is tuned to the $^{1}H$ proton magnetic resonance frequency, so that the scanner 10 is configurable to perform multi-nuclear magnetic resonance spectroscopy or imaging by acquiring both the $^{1}H$ and $^{31}P$ resonances. Although illustrated as separate coils constructions, the $^{1}H$ and $^{31}P$ coils can be mounted on a common substrate and have a common field of view. In other embodiments, the coils are tuned to other nuclear species besides $^{1}H$ and $^{31}P$.

In some embodiments, one or more local coils are provided which are each tuned to the same magnetic resonance frequency (for example, one, two, three, or more local coils each tuned to the $^{1}H$ proton magnetic resonance frequency). In some embodiments, one or more local coils are used for magnetic resonance excitation, and the whole-body coil 30 is optionally omitted. In some embodiments, the one or more local coils include a head coil, arm coil, or so forth.

During proton magnetic resonance data acquisition, a radio frequency transmitter 46 is coupled to the whole-body radio frequency coil 30, or to another radio frequency coil, to generate proton magnetic resonance signals in a region of interest of a subject disposed in the bore 14. A magnetic field gradients controller 48 operates the magnetic field gradient coils 28 to spatially localize, spatially encode, or otherwise manipulate the generated magnetic resonances. During the readout phase, a first radio frequency receiver 50 coupled with the proton coil 42 receives the $^{1}H$ proton magnetic resonance. In one approach for multi-nuclear magnetic resonance experiments, the $^{31}P$ coil is of a transmit/receive coil, and is coupled during the transmit phase with a second radio frequency transmitter 52 tuned to excite $^{31}P$ magnetic resonance, and is coupled during the readout phase with a second radio frequency receiver 54 that receives the $^{31}P$ magnetic resonance. Typically, the magnetic field gradients coils 28 are also used to spatially localize, spatially encode, or otherwise manipulate the $^{31}P$ magnetic resonances. A data buffer 56 stores the $^{31}P$ and $^{1}H$ magnetic resonance signals in separate buffer areas 60, 62, respectively.

A post-acquisition processor 66 processes the acquired magnetic resonance data. For example, the post-acquisition processor 66 can include an image reconstruction processor that processes spatially encoded magnetic resonance data using a Fast Fourier Transform (FFT) or other reconstruction algorithm to generate a spatial map or image of the imaging subject. The post-acquisition processor 66 can include a ratioing processor that determines a $^{31}P/^{1}H$ magnetic resonance ratio at each spatial voxel to generate a ratio image or map. Other types of post-acquisition processing can also be performed. A processed data memory 70 stored the processed spatial map or image, ratio data, or other processed data. A user interface 72 displays the processed data to a user. In the example embodiment illustrated in FIG. 1, the user interface 72 also interfaces the user with a scanner controller 74 to control the magnetic resonance scanner 10. In other embodiments, a separate scanner control interface may be provided. If the user interface 72 is a computer, then the post-acquisition processor 66 or other processing components can be integrated with the user interface 72 as software components.

With reference to FIG. 2, the phosphorous radio frequency coil 40 is described. FIG. 2 shows the phosphorous coil 40 with a cover of a housing removed to reveal internal components of the phosphorous coil 40 supported on a substrate or housing portion 78. These internal components include coil conductors 80, 82. The coil loop conductors 80, 82 along with tuning capacitors 86 and on-board coil electronics 90 define an operative radio frequency circuit 100 tuned to the $^{31}P$ magnetic resonance frequency and spatially configured to receive $^{31}P$ magnetic resonance from the spatial region of interest in the bore 14. The phosphorous coil 40 may include other components, such as an additional capacitor 88.

The phosphorous coil 40 is not intended to receive $^{1}H$ magnetic resonance signals, and is designed to not conduct substantial current at the $^{1}H$ magnetic resonance frequency. Toward this end, a trap radio frequency circuit 110 is coupled with the operative radio frequency circuit 100. The trap radio frequency circuit 110 is disposed with the operative radio frequency circuit 100 on the phosphorous coil 40, and includes a generally linear transmission line 120 having a first end 122 at which the operative radio frequency circuit 100 and the trap radio frequency circuit 110 are coupled together, and a second end 124 at which the generally linear transmission line 120 is terminated with a short or other termination impedance. A capacitance 126 bridges a gap between the coil loop conductor 82 and capacitor 86, which is connected to conductor 80 of the operative radio frequency circuit 100, and the generally linear transmission line 120 is connected in parallel across the capacitance 126. The coupled trap radio frequency circuit 110 is tuned to have a high impedance at the $^{1}H$ magnetic resonance frequency to substantially block currents at the $^{1}H$ resonance frequency in the operative radio frequency circuit 100.

With continuing reference to FIG. 2 and with further reference to FIG. 3, in the illustrated embodiment the generally linear transmission line 120 is a coaxial cable including an inner conductor 130 and a coaxial sheath 132. The inner conductor 130 and coaxial sheath 132 are electrically insulated from one another along the cable, for example by a dielectric material (not shown) that fills an annular gap between the inner conductor 130 and the coaxial sheath 132. At the first end 122, the inner conductor 130 and coaxial sheath 132 are connected at opposite sides of the capacitance 126 across the gap between the coil loop conductor 82 and the capacitor 86 connected to conductor 80 of the operative radio frequency circuit 100. At the second end 124, the coaxial cable is short-circuit terminated by bending an end-portion 136 of the inner conductor 130 around and soldering or otherwise electrically connecting it with the coaxial sheath 132. Other physical embodiments of short-circuit termination are also contemplated, such as employing a large solder bump or conductive end cap that spans the gap between the inner conductor and the sheath at the second end. In other contemplated embodiments, the termination impedance at the second end 124 can include a termination impedance other than a short circuit termination impedance. For example, the second end 124 can be terminated by a capacitance or an open circuit.

The impedance of the generally linear transmission line 120 as seen from the first end 122 is a function of the resistance per unit length and dielectric characteristics of the transmission line 120, the length of the transmission line 120, and the nature of the termination at the second end 124. Standard transmission line equations can be used to estimate the impedance of the generally linear transmission line 120 for various second-end terminations such as the illustrated short-circuit termination, or termination by a discrete lumped-component capacitor or other impedance component. For a suitable length, the generally linear transmission line 120 acts as an effective inductance. The effective inductance defined by the generally linear transmission line 120 is connected in parallel across the capacitance 126 to define a trap circuit having high impedance at the $^1$H magnetic resonance frequency. The trap radio frequency circuit 110 is suitably fine-tuned by selection of the capacitance 126, by employing a tunable variable capacitor as the capacitance 126, or by adjusting the length of the generally linear transmission line 120 by cutting and re-terminating the second end 124 until the desired inductance is achieved.

The effective inductance is not affected by gradual curvature of the of the generally linear transmission line 120. Accordingly, as shown in FIG. 2 the generally linear transmission line 120 can be conformally positioned and curved along the curvature of one of the conductors 80, 82 of the operative radio frequency circuit 100. In FIG. 2, the generally linear transmission line 120 lies along a portion of the conductor 82. As diagrammatically shown in FIG. 3, for the coaxial cable embodiment of the generally linear transmission line 120, the trap currents flow along the inner conductor 130 and along the inside surface of the sheath 132. The trap current is shielded by the sheath 132, thus substantially reducing radio frequency leakage.

Moreover, because of the trap current shielding provided by the sheath 132, the outer surface of the sheath 132 can optionally be electrically connected with the conductor 82 of the operative radio frequency circuit 100. In FIG. 2, for example, electrically conductive solder bonds 140 secure the sheath 132 to the conductor 82. This arrangement provides mechanical sturdiness, and substantially reduces distortion of the magnetic resonance by the bulk of the coaxial transmission line 120.

The illustrated coaxial cable transmission line 120 is an example. In other embodiments, the generally linear transmission line can be a stripline, a micro-stripline, or other type of generally linear transmission line. In some contemplated embodiments, one of the conductors of the operative radio frequency circuit is a generally hollow conductor defining an internal cavity, and the generally linear transmission line is disposed in the internal cavity to provide shielding. In some contemplated embodiments, the internal cavity is elongated, and the generally linear transmission line includes a linear conductor disposed in the elongated internal cavity of the generally hollow conductor, so that the linear conductor and an electrically conductive inner surface of the generally hollow conductor of the operative radio frequency circuit cooperatively define the generally linear transmission line. In such embodiments, the linear conductor is electrically separated from the electrically conductive inner surface of the generally hollow conductor except at the second end termination.

With reference to FIG. 4, the proton radio frequency coil 42 is described. The proton coil 42 includes most of the same components as the phosphorous coil 40, and includes an operative radio frequency circuit 100' with capacitors 86', 88' having capacitance values selected to tune the proton coil 42 to the $^1$H magnetic resonance frequency. A trap radio frequency circuit 110' of the proton coil 42 is similar to the corresponding circuit of the phosphorous coil 40, including the generally linear transmission line 120 and a capacitance 126' connected in parallel across a gap between the coil loop conductor 82 and the tuning capacitor 86', which is connected to coil loop conductor 80. The trap radio frequency circuit 110' is tuned to the $^1$H resonance frequency. The trap radio frequency circuit 110' decouples the proton coil 42 during the transmit phase of the magnetic resonance acquisition. The proton coil 42 is tuned to the $^1$H resonance frequency during the receive phase of the magnetic resonance acquisition. Accordingly, the trap radio frequency circuit 110' of the proton coil 42 has a modified first end 122' that includes a switch 150 for selectively coupling the trap radio frequency circuit 110' with the operative radio frequency circuit 100'.

The switch 150 includes a PIN switching diode 152 connected in series with the inner conductor 130, and associated biasing circuitry 154. Because the PIN switching diode 152 has an associated capacitance, the capacitance 126' combines in series with the capacitance of the PIN diode 152 to define the resonance frequency of the trap radio frequency circuit 110'. On-board coil electronics 90' of the proton coil 42 include decoupling control circuitry operated by the proton radio frequency receiver 50 responsive to control signals provided by the scanner controller 74. Under this control, the biasing circuitry 154 d.c. biases the PIN switching diode 152 into a conductive or closed state to operatively couple the trap radio frequency circuit 110' and the operative radio frequency circuit 100' to detune the latter during the radio frequency transmit phase. During the receive phase, the biasing circuitry 154 biases the PIN switching diode 152 into a non-conductive or open state to operatively decouple the trap radio frequency circuit 110' and the operative radio frequency circuit 100' so that the operative radio frequency circuit 100' can receive at the $^1$H magnetic resonance frequency during the receive phase. Alternatively, the bias circuit can bias the PIN diode conductive in response to currents induced by the excitation pulse.

The described coils 40, 42 are both surface coils. However, the disclosed trap radio frequency circuitry approaches can also be practiced in conjunction with other types of local coils such as head coils, arm coils, and so forth. In the case of a birdcage-type head coil, for example, a coaxial transmission line component of a trap radio frequency circuit can be disposed along one of the rungs of the head coil. Moreover, more than one trap radio frequency circuit can be included in a single radio frequency coil. Such different traps can be tuned to block different frequencies, or can be tuned to the same frequency to provide improved blocking of the trapped frequency.

The invention has been described with reference to the preferred embodiments. Obviously, modifications and alterations will occur to others upon reading and understanding the preceding detailed description. It is intended that the invention be construed as including all such modifications Having described the preferred embodiments, the invention is now claimed to be:

1. A radio frequency coil comprising:
an operative radio frequency circuit tuned to a magnetic resonance frequency and spatially configured to at least one of generate magnetic resonance in or receive magnetic resonance from a spatial region of interest; and
a trap radio frequency circuit tuned to block a selected frequency, being disposed with the operative radio frequency circuit, and including at least a generally linear transmission line having a first end at which the operative radio frequency circuit and the trap radio frequency circuit are coupled together and a second end at which the generally linear transmission line is terminated with a termination impedance, the generally linear transmission line including an inner conductor and a coaxially arranged sheath, the inner conductor and the sheath being connected with the operative radio frequency circuit at the first end, the inner conductor and the sheath being electrically terminated at the second end by the termination impedance;
wherein the generally linear transmission line is arranged along or forms a part of at least a portion of a conductor of the operative radio frequency circuit.

2. The radio frequency coil as set forth in claim 1, wherein the generally linear transmission line is terminated at the second end by the termination impedance which is one of a short circuit and a capacitance.

3. The radio frequency coil as set forth in claim 1, wherein the conductor of the operative radio frequency circuit along which the generally linear transmission line is arranged is a coil loop conductor.

4. The radio frequency coil as set forth in claim 1, wherein at least a portion of an outside of the sheath of the generally linear transmission line is electrically connected with the portion of the conductor of the operative radio frequency circuit along which it is arranged.

5. The radio frequency coil as set forth in claim 1, wherein the inner conductor and the sheath of the generally linear transmission line are connected across a capacitor connected with the operative radio frequency circuit.

6. A radio frequency coil comprising:
an operative radio frequency circuit tuned to a magnetic resonance frequency and spatially configured to at least one of generate magnetic resonance in or receive magnetic resonance from a spatial region of interest; and
a trap radio frequency circuit tuned to block a selected frequency, being disposed with the operative radio frequency circuit, and including at least a generally linear transmission line having a first end at which the operative radio frequency circuit and the trap radio frequency circuit are coupled together and a second end at which the generally linear transmission line is terminated with a termination impedance;
wherein the operative radio frequency circuit includes a conductor, and the generally linear transmission line of the trap radio frequency circuit is conformally positioned along the conductor of the operative radio frequency circuit.

7. The radio frequency coil as set forth in claim 6, wherein the termination impedance is a short circuit.

8. The radio frequency coil as set forth in claim 6, further comprising:
a switch operable to selectively couple together the trap radio frequency circuit and the operative radio frequency circuit.

9. The radio frequency coil as set forth in claim 8, wherein the magnetic resonance frequency and the selected frequency are the same, the trap radio frequency circuit effectuating detuning of the operative radio frequency circuit when coupled.

10. The radio frequency coil as set forth in claim 6, wherein the magnetic resonance frequency and the selected frequency are different.

11. The radio frequency coil as set forth in claim 6, wherein the conductor of the operative radio frequency circuit defines a curve, and the generally linear transmission line conforms with the curve defined by the generally linear conductor of the operative radio frequency circuit.

12. The radio frequency coil as set forth in claim 6, wherein the conformally positioned generally linear transmission line is one of:
a coaxial cable,
a stripline,
a coaxial cable disposed in an internal cavity of a conductor of the operative radio frequency circuit, and
a linear conductor disposed in an elongated internal cavity of a conductor of the operative radio frequency circuit and coupled with inner conductive walls of the elongated internal cavity.

13. A magnetic resonance system comprising:
a main magnet for generating a main magnetic field in a spatial region of interest;
magnetic field gradient coils for superimposing selected magnetic field gradients on the main magnetic field; and
a radio frequency coil as set forth in claim 6.

14. A magnetic resonance coil for at least receiving resonance signals, the coil comprising:
an operative radio frequency circuit tuned to a magnetic resonance frequency and spatially configured to at least one of generate magnetic resonance in or receive magnetic resonance from a spatial region of interest; and
a trap radio frequency circuit tuned to block a selected frequency, the trap radio frequency circuit being disposed with the operative radio frequency circuit and including a coaxial cable, the coaxial cable having a first end at which an inner conductor and a coaxial sheath are electrically connected with the operative radio frequency circuit and a second end at which the inner conductor and coaxial sheath are terminated by a capacitance or an open circuit.

15. The coil as set forth in claim 14, wherein the coaxial cable is arranged along a conductor of the operative radio frequency circuit.

16. The coil as set forth in claim 15, wherein the conductor along which the coaxial cable is arranged is not straight, and the coaxial cable is arranged curved to conform with the conductor.

17. The coil as set forth in claim 14, wherein the inner conductor and the sheath of the coaxial cable are connected across a capacitor connected with the operative radio frequency circuit.

* * * * *